United States Patent [19]

Nilsson et al.

[11] 4,340,774

[45] Jul. 20, 1982

[54] DEVICE FOR MOUNTING CIRCUIT COMPONENTS ON A CIRCUIT BOARD

[76] Inventors: Sören G. Nilsson, Uppakravägen 2, Bålsta, Sweden, S-190 60; Leif R. Carneborn, Såningsvägen 192, Järfälla, Sweden, S-175 45

[21] Appl. No.: 885,255

[22] Filed: Mar. 10, 1978

[30] Foreign Application Priority Data

Mar. 10, 1977 [SE] Sweden .................. 77026904

[51] Int. Cl.³ ............... H05K 13/04; H05K 3/30
[52] U.S. Cl. .................... 174/138 G; 29/837;
40/2 R; 339/113 B; 361/400; 428/131
[58] Field of Search .......... 174/52 FP, 112, 138 R,
174/138 G; 29/626; 40/2 R, 316; 35/19 A;
228/180 R; 339/17 CF, 113 R, 113 B; 361/400,
403, 404, 405, 408, 409; 428/131

[56] References Cited

U.S. PATENT DOCUMENTS 3,522,483 8/1970 Hennessey .............. 174/138 G X
3,721,941 3/1973 Wisser ..................... 174/52 FP X
3,989,338 11/1976 Gosser ..................... 174/112 X

FOREIGN PATENT DOCUMENTS 549530 12/1957 Canada .................. 174/138 G
1283468 7/1972 United Kingdom .

OTHER PUBLICATIONS

Fluorocarbon Products Inc. Advertisement, *Electronic Design*, Jan. 22, 1958, p. 88.

*Primary Examiner*—Laramie E. Askin
*Attorney, Agent, or Firm*—Browdy and Neimark

[57] ABSTRACT

A method of and arrangement for mounting an electric component, which comprises a holding socket having contact legs, on a circuit board. The holding socket is placed in a desirable position by inserting the contact legs into corresponding apertures of the circuit board, and is preliminarily fixed with respect to the circuit board by the use of a device in the shape of an apertured, non-conductive plate which is applied on the protruding contact legs on the opposite side of the circuit board. The plate retains the socket by friction forces which are present between one or more of the contact legs and the edges of pertaining apertures in the plate. Thereafter the wiring of the protruding legs is performed.

5 Claims, 1 Drawing Figure

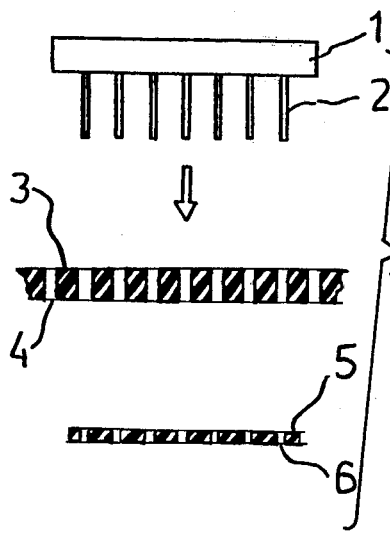 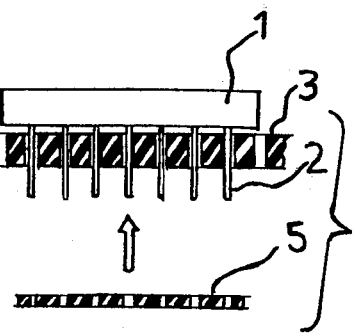 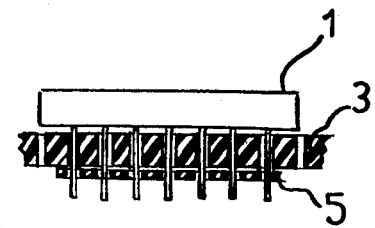
Fig. 1a          Fig. 1b          Fig. 1c
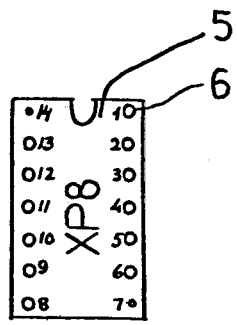 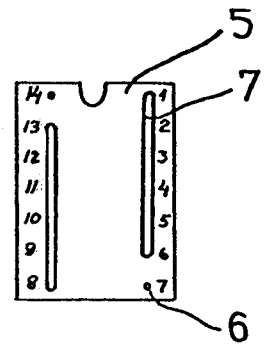
Fig. 2          Fig. 3

DEVICE FOR MOUNTING CIRCUIT COMPONENTS ON A CIRCUIT BOARD

This invention is directed to a device for mounting an electric component which comprises a socket having contact legs, in which said socket or, alternatively, a socket holder intended therefor and having corresponding contact legs, is arranged in a desirable position by insertion of the contact legs into corresponding apertures of a circuit board, and in which wiring is connected to the contact legs protruding on the opposite side of the circuit board.

The mounting means according to the invention are in principle useful for mounting of components of any kind but the following description will for the sake of clearness be directed to the use of the invention in connection with integrated circuits and, on the first hand, to components having a socket of so called DIP-type ("dual in-line package") which are referred to as DIP-components in the following text and which as known are provided with two parallel rows of contact legs.

In general, when mounting DIP-components on a circuit board, a DIP-holder which is adapted to the component and provided with the corresponding number of contact legs is used, which is first mounted on the circuit board, while the component is thereafter inserted into the holder.

Commonly used circuit boards are standardized and are provided with a regular pattern of apertures the diameter of which is somewhat larger than the contact leg diameter of the component or the holder. The center distance between the apertures corresponds to the same distance between the contact legs.

A usual work situation in for example a development laboratory is that a number of DIP-components are to be mounted on a circuit board. With the techniques of today the components or the corresponding holders are arranged separately on the circuit board and in doing this the contact legs of e.g. a given holder are inserted into a corresponding number of apertures of the circuit board and the holder is thereafter fixed with respect to the circuit board in order not to leave the same when the circuit board is thereafter turned over for wiring of the contact legs protruding on the opposite side of the circuit board. The fixing is ordinarily effected by carrying out a certain amount of the wiring to the contact legs. The same procedure is repeated for other holders. It is obvious that the repeated change between the different operations of work: insertion of the contact legs of the holder into selected apertures of the circuit board, turning over the circuit board while maintaining temporarily (e.g. manually) the holder, providing wiring, again turning over the circuit board, and so on, is inefficient and time consuming. The wiring itself becomes more difficult by the fact that it is performed so to say from the underside while the reference numbers of the contact legs are referred to the component regarded from above in the corresponding data sheets. The consequence is that the installer in practice is forced to turn over the circuit board to its correct side between every single wiring to the contact legs so as to obtain a reasonably sure identification of the contact legs. Nevertheless the risk of failure is great.

The main object of the invention is to provide a solution to the problems described above and to make possible a simplified mounting of components provided in holding sockets having contact legs on a circuit board with a lower failure rate which mounting is less time consuming.

This object is obtained by a means as mentioned above for mounting on a circuit board of an electric component which comprises a holding socket having contact legs, including positioning said socket in a desirable position by inserting said contact legs into corresponding apertures of said circuit board; preliminarily fixing the socket with respect to the circuit board by application of a plate on the protruding contact legs on the opposite side of the circuit board, the plate retaining the socket by friction forces between one or more of the contact legs and the edges of pertaining apertures of the plate; and wiring the protruding contact legs.

Investigation has shown that it is possible by the means according to the invention to obtain a time saving of the order of several hours when mounting a circuit board of about the size $15 \times 15$ cm$^2$ and a usual component packing density.

A device for carrying out the objects of the invention comprises a plate of an electrically insulating material, the plate being provided with apertures for the contact legs and having a shape such that it may be pushed onto the contact legs and retained thereon by friction forces between one or more contact legs and the edges of pertaining apertures. The plate is preferably intended to be used only once and has the advantage of an extremely low manufacturing cost.

The invention will be described closer in connection to one embodiment of a device for carrying out the objects and with reference to the drawings, in which:

FIGS. 1a, b, c disclose the different work operations for preliminarily attaching a DIP-holder relative to a circuit board, FIG. 2 discloses a plan view of the plate used in FIGS. 1a, 1b, 1c and FIG. 3 discloses a modified embodiment of the plate shown in FIG. 2.

FIG. 1a shows a side view of one so-called DIP-holder 1 intended for a DIP-component having 7+7 contact legs 2 arranged in two parallel rows along the component sides. The contact legs of the holder and the component are adapted to each other in a manner such that the component may be inserted into the holder when the mounting of the same is finished. A circuit board 3 is shown in a section along a line of apertures 4; as illustrated these apertures are of given diameter or width. The circuit board 3 is of a standard type in which the apertures 4 are arranged regularly at internal distances adapted to the distance between the contact legs 2. FIG. 1a furthermore shows a cross-section of a plate 5 for a preliminary fixation of the DIP-holder 1 relative to the circuit board 3 by the device according to the invention. The plate, which will be described in more detail below with reference to FIGS. 2 and 3, is provided with apertures 6 the number and positions of which are adapted to the contact legs 2 of the holder 1. The apertures 6 are of a diameter or width less than the apertures 4 and of such cross-section that the contact legs 2 or at least one of them is held in place by forces produced by friction.

When mounting the DIP-holder 1, the contact legs thereof are inserted into corresponding apertures 4 of the circuit board (FIG. 1a) so that the holder will obtain the position shown in FIG. 1b, whereby the contact legs 2 of the holder are brought to protrude from the opposite side of the circuit board. Thereafter the plate 5 (see FIG. 1b) is applied on the protruding contact legs 2 from the other side of the circuit board. During this application the contact legs 2 are inserted against a certain amount of frictional counteraction into the corresponding apertures 6 of the plate 5 so that the plate will obtain the position shown in FIG. 1c. As a consequence of frictional forces between the contact legs 2 and the edges of the apertures 6, the intended preliminary fixing of the holder 1 with respect to the circuit board 3 is obtained. From this follows that the circuit board may be turned and turned over with the holder kept in an unchanged position during the mounting operations which follow.

FIG. 2 shows one embodiment of a plate according to the invention. The plate 5 is intended for a DIP-holder socket having 14 contact legs 2 (see also FIG. 1a) and is therefore provided with 14 apertures 6. The diameter of the apertures 6 has been chosen somewhat smaller than the diameter of the contact legs 2 so as to obtain frictional forces of a desirable amount between the contact legs and the apertures. The plate is manufactured of an electrically insulating material, for example paper or plastics of an adequate quality. Adjacent the apertures reference numerals are provided which in this case are current numbers corresponding to the contact leg reference numerals which are used in a data sheet pertaining to the component. Preferably, a material which is adequate for hand writing is used for the plate so that it can be provided with a component reference, as for example XP8 in FIG. 2, in connection with the mounting for the identification of the component in a circuit diagram.

FIG. 3 shows a modified embodiment of the plate shown in FIG. 2 in which the apertures 8-13 and 6-1 have been replaced by slots 7 the width of which may be identical with the aperture diameter of the remaining apertures denoted 7 and 14, respectively. The object of the slots 7 is to facilitate the application of the plate onto the contact legs 2. It is obvious that the shape of the apertures or the recesses and also the geometrical shape of the plate may be modified in several ways without changing the function of the plate.

The plates shown in FIGS. 2 and 3 may be manufactured at one place and used in others or can be formed as needed from a continuous strip of the same width as the plate and being provided with continuous rows of apertures corresponding to the aperture rows 1-7 and 8-14 along the edges at the place where they are to be used along the edges. If so, a section of the strip having a length which is adapted to the component is separated and provided with aperture references. The disadvantage is that the aperture references must necessarily be introduced by hand on the plate but this may in some applications be compensated by the fact that one must not necessarily have different types of plates available for different components, for example DIP-holders having 14 and 16 contact legs, respectively.

What is claimed is:

1. A device for mounting an electric component in the form of a holding socket with contact legs of known axial cross section and shape on a circuit board having apertures therein, the device comprising a plate of an electrically insulating material, said plate having a geometrical shape and a size corresponding to the shape and size of said socket in the plane of said circuit board; apertures in said plate corresponding in axial position to those in said circuit board for penetration by said contact legs, at least one of said apertures in said plate being of a size and shape which is to provide friction forces between at least one of said contact legs and the edge of said at least one of said apertures in said plate; and reference characters corresponding to said legs on said plate at the edge of corresponding, respective said apertures in said plate.

2. A device as claimed in claim 1, wherein said plate consists of paper board or plastic material of a quality which is adequate for handwriting.

3. A device as claimed in claim 1, for preliminary fixation of said socket in form of a DIP-holder, wherein said plate is provided with one aperture for each contact leg of said DIP-holder and with said reference characters corresponding to references assigned to said contact legs of said DIP-holder.

4. A device as claimed in claim 1 wherein at least some of said apertures in said plate are shaped as parallel slots having a width which is to provide friction between a plurality of said contact legs and the edges of said slots.

5. A device as claimed in claim 1, wherein all of said apertures in said plate are sized to provide friction between said contact legs and edges of said apertures in said plate.

* * * * *